US012761796B2

(12) United States Patent
McNeil et al.

(10) Patent No.: US 12,761,796 B2
(45) **Date of Patent: *Oct. 13, 2026**

(54) COPYBACK CLEAR COMMAND FOR PERFORMING A SCAN AND READ IN A MEMORY DEVICE

(71) Applicant: Micron Technology, Inc., Boise, ID (US)

(72) Inventors: Jeffrey S. McNeil, Nampa, ID (US); Sivagnanam Parthasarathy, Carlsbad, CA (US); Kishore Kumar Muchherla, Fremont, CA (US); Patrick R. Khayat, San Diego, CA (US); Sead Zildzic, Rancho Cordova, CA (US); Violante Moschiano, Avezzano (IT); James Fitzpatrick, Laguna Niguel, CA (US)

(73) Assignee: Micron Technology, Inc., Boise, ID (US)

( * ) Notice: Subject to any disclaimer, the term of this patent is extended or adjusted under 35 U.S.C. 154(b) by 192 days.

This patent is subject to a terminal disclaimer.

(21) Appl. No.: 18/886,901

(22) Filed: Sep. 16, 2024

(65) Prior Publication Data

US 2025/0004645 A1 Jan. 2, 2025

Related U.S. Application Data

(63) Continuation of application No. 17/978,890, filed on Nov. 1, 2022, now Pat. No. 12,105,961.

(Continued)

(51) Int. Cl.

| | |
|---|---|
| ***G06F 3/06*** | (2006.01) |
| ***G11C 16/34*** | (2006.01) |
| ***G11C 29/52*** | (2006.01) |

(52) U.S. Cl.

CPC ............ *G06F 3/0611* (2013.01); *G06F 3/064* (2013.01); *G06F 3/0679* (2013.01); *G11C 16/3459* (2013.01); *G11C 29/52* (2013.01)

(58) Field of Classification Search

CPC ...... G06F 3/0611; G06F 3/064; G06F 3/0679; G06F 12/0804; G06F 2212/1024;

(Continued)

(56) References Cited

U.S. PATENT DOCUMENTS

| | | | | |
|---|---|---|---|---|
| 9,953,709 | B2 | 4/2018 | Shirakawa et al. | |
| 12,105,961 | B2 * | 10/2024 | McNeil .............. | G11C 16/0483 |

(Continued)

FOREIGN PATENT DOCUMENTS

| | | | |
|---|---|---|---|
| CN | 106997783 | A | 8/2017 |
| CN | 113160868 | A | 7/2021 |

*Primary Examiner* — Uyen Smet

(74) *Attorney, Agent, or Firm* — Lowenstein Sandler LLP

(57) ABSTRACT

A memory device includes array(s) of memory cells including first memory cells configured as single-level cell memory and second memory cells configured as higher-level cell memory. Page buffer(s) are coupled with the array(s). Logic is coupled with the page buffer(s) and to cause, in response to receipt of a copyback clear command, a page buffer to perform a dual-strobe read operation on the first memory cells, the dual-strobe read operation including a soft strobe at a first threshold voltage and a hard strobe at a second threshold voltage. The logic causes the page buffer to determine a number of one bit values within a threshold voltage range between the first threshold voltage and the second threshold voltage. The logic causes, responsive to the number of one bit values not satisfying a threshold criterion, a copyback be performed of data in the first memory cells to the second memory cells.

20 Claims, 10 Drawing Sheets

Related U.S. Application Data

(60) Provisional application No. 63/277,430, filed on Nov. 9, 2021.

(58) Field of Classification Search
CPC ........ G06F 2212/2022; G11C 16/3459; G11C 29/52; G11C 2029/0411; G11C 2211/5641; G11C 16/0483; G11C 11/5642; G11C 16/26; G11C 16/10; G11C 29/42
See application file for complete search history.

(56) References Cited

U.S. PATENT DOCUMENTS

| | | | | |
|---|---|---|---|---|
| 2015/0193302 | A1 | 7/2015 | Hyun et al. | |
| 2017/0097869 | A1 | 4/2017 | Sharon et al. | |
| 2018/0068729 | A1 | 3/2018 | Shirakawa et al. | |
| 2018/0261300 | A1 | 9/2018 | Shimizu | |
| 2019/0304516 | A1 | 10/2019 | Shimizu et al. | |
| 2021/0011656 | A1* | 1/2021 | Sheperek | G11C 16/26 |

* cited by examiner

COPYBACK CLEAR COMMAND FOR PERFORMING A SCAN AND READ IN A MEMORY DEVICE

REFERENCE TO RELATED APPLICATION

The present application is a continuation of U.S. patent application Ser. No. 17/978,890, filed Nov. 1, 2022 (now U.S. Pat. No. 12,105,961), which claims the benefit of U.S. Provisional Patent Application No. 63/277,430, filed Nov. 9, 2021, the entireties of which are incorporated herein by reference.

TECHNICAL FIELD

Embodiments of the disclosure are generally related to memory sub-systems, and more specifically, relate to a copyback clear command for performing a scan and read in a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Figure 1A:
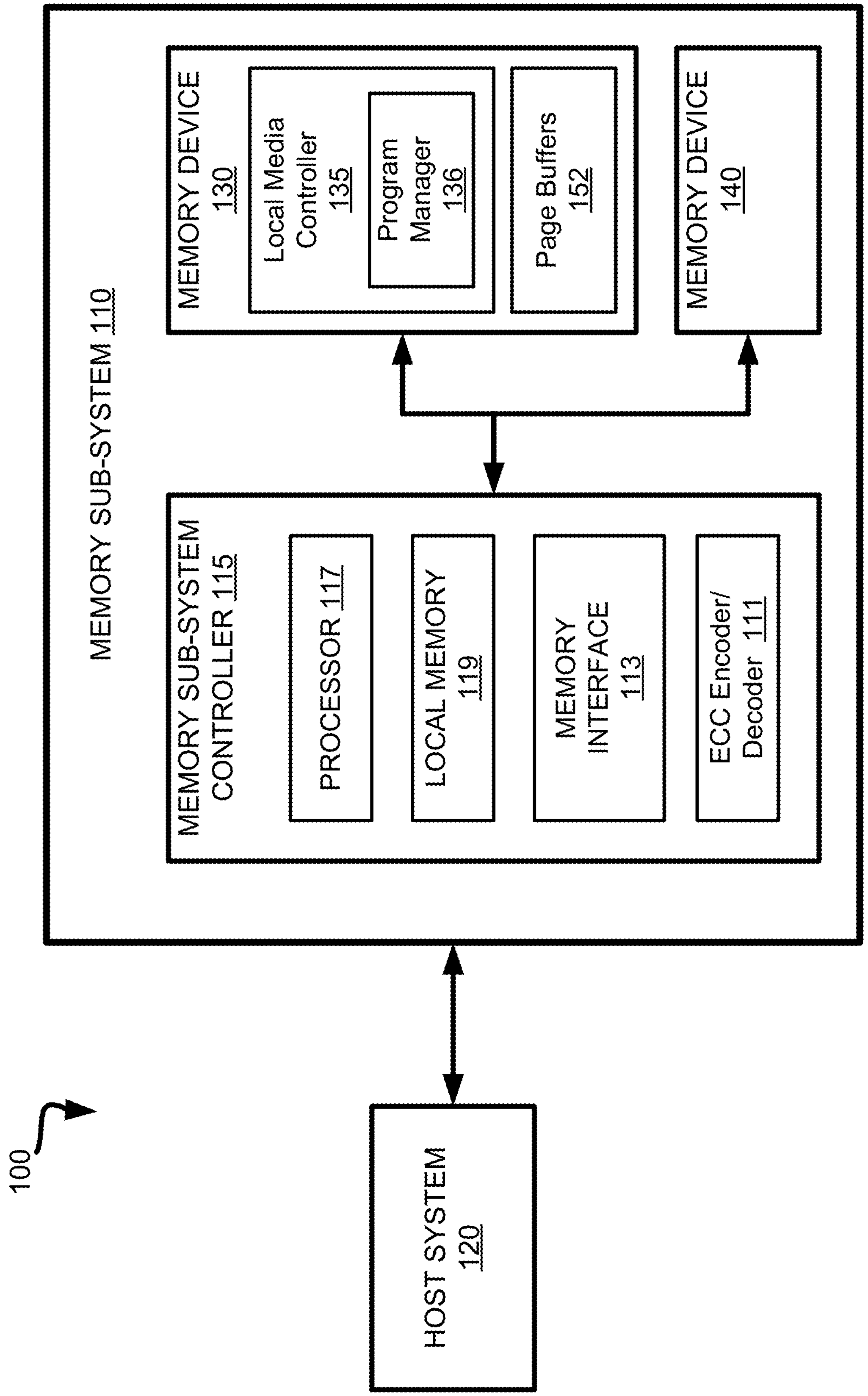
FIG. 1A illustrates an example computing system that includes a memory sub-system according to some embodiments.

Embodiments of the present disclosure are directed to a copyback clear command for performing a scan and read in a memory device. In certain memory devices, such as NOT-AND (NAND) memory devices, each memory device includes one or more arrays of memory cells. The one or more array of memory cells can include first memory cells configured as single-level cell (SLC) memory, which can store one bit per cell, and second memory cells configured as higher-level cell (HLC) memory, which can store more than one bit per cell. The HLC memory, for example, can include multi-level cells (MLCs), triple-level cells (TLCs), quad-level cells (QLCs), and/or penta-level cells (PLCs), each of which stores multiple bits per cell as a logical state depending on a threshold voltage stored in each cell. The memory cells of the memory devices can be grouped as pages that can refer to a logical unit of the memory device used to store data. With some types of memory (e.g., NAND), pages can be grouped to form blocks.

In these memory devices, a memory sub-system controller controls a copyback and/or internal data move (IDM) processes (referred to jointly herein as "copyback") in which data are copied from the SLC memory to the HLC memory. This copyback process is also referred to as folding or compacting data from the SLC memory into the HLC memory, as multiple bits of SLC data can be stored within a single cell of the HLC memory. The memory sub-system controller can control executing a copyback within the memory device, for example, to convert SLC data to high-density data and thereby free up additional memory array space for more data. In some cases, the SLC memory is used as SLC cache where the data stored in SLC cache are copied into HLC data as the memory device is freed up from other program, read, and erase operations to do so.

In these memory devices, because errors in SLC data are amplified and generally uncorrectable once copied back into HLC memory, the memory sub-system controller takes steps to ensure the SLC data is sufficiently error free, e.g., that the copyback read bit error rate (RBER) is less than a particular high reliability error threshold (HRER) specification. To do so, the controller performs a scan of the SLC data by reading the SLC data out, decoding the SLC data according to an error correction code (ECC) algorithm, and doing an error check on the SLC data. Because sometimes errors can come from defects in individual pillars, channels, and/or wordlines, each wordline is scanned, e.g., in lieu of selectively checking data associated with only certain wordlines. This means that a large amount of SLC data is read out and error checked before the controller can proceed with directing the memory device to perform the copyback.

In these memory devices, if certain errors are detected and are correctable, the controller can correct the errors and re-encode the SLC data before being programmed into the HLC memory. If, however, the errors that are detected are not correctable, the controller performs a refresh of the SLC data before the data is re-encoded and programmed into the HLC memory. Because HLC memory is becoming more common and SLC memory is often used as cache to maintain high performance, the copyback process is performed often, causing these memory devices to incur significant performance penalties in latency, e.g., in the scanning and reading of the SLC data to clear the SLC data to be copied back into HLC memory, and in data bus congestion.

Aspects of the present disclosure address the above and other deficiencies by the memory sub-system controller (e.g., processing device) employing the use of a copyback clear command. The copyback clear command, also referred to herein as a single bit soft bit read (SBSBR) command, directs the memory device to perform an initial health check of the SLC data, which if it passes, allows the memory device to automatically proceed with the copyback without further intervention by the memory sub-system controller. For example, a local media controller (e.g., control logic) of the memory device can act on a copyback clear command received from the processing device. In one embodiment, in executing the copyback clear command, the control logic causes a page buffer to perform a dual-strobe read operation on targeted SLC memory cells. In at least some embodiments, the dual-strobe read operation includes a soft strobe at a first threshold voltage and a hard strobe at a second threshold voltage that are serially performed. The first threshold voltage and the second threshold voltage can be sensed approximately between threshold voltage distributions of a set of the first memory cells, e.g., of the SLC memory cells. In other words, the first and second threshold voltages are targeted to fall within a valley identified between the threshold voltage distributions.

In at least these embodiments, the control logic further causes a page buffer to determine a number of one bit values within the threshold voltage distributions detected in a threshold voltage range between the first threshold voltage and the second threshold voltage. The more one bit values detected in the first memory cells within the threshold voltage range, the higher the likelihood that the RBER is going to be high for the set of the first memory cells. The control logic can thus further cause, in response to the number of one bit values not satisfying a threshold criterion, a copyback be performed of data in the set of the first memory cells to a set of the second memory cells (e.g., the HLC memory cells) without intervention from the processing device. The threshold criterion, for example, can be a value corresponding to a specific HRER, which if satisfied, indicates an RBER that is too high to pass the initial health check. This specific HRER can be somewhat lower than the previously mentioned particular HRER to take caution in clearing the SLC data of errors without a full error check. Thus, if the threshold criterion is satisfied, the control logic does not cause the copyback of the data to be performed and the memory sub-system controller can perform further error checking.

In these embodiments, the control logic can further cause the page buffer to store, in a status register, either a pass indicator value or a fail indicator value depending on whether the number of one bit values satisfies the threshold criterion. The status register can be accessible by the processing device, which can thus know the health status of the SLC data before deciding how to proceed in relation to the copyback of the SLC data to the set of the second memory cells. In response to detecting the pass indicator value in the status register, for example, the processing device can take no further action, enabling the memory device to perform a copyback of the data to the plurality of the second memory cells. In response to detecting the fail indicator value in the status register, the processing device can retrieve health data from a set of latches of the memory device and determine, from the health data, whether to perform an error correction or a block refresh on the set of the first memory cells, e.g., depending on how many one bit values are detected within the threshold voltage range between the threshold voltage distributions.

Therefore, advantages of the systems and methods implemented in accordance with some embodiments of the present disclosure include, but are not limited to, a reduction in complexity and improvement in performance of clearing SLC data stored in SLC memory cells to be copied back into HLC memory cells. This increase in performance includes reduced latency, particularly when the processing device need take no further action before the copyback is performed, and less congestion on a data bus (e.g., open NAND flash interface (ONFI) bus) located between the memory sub-system controller and the memory device when avoiding reading out and error checking the SLC data. Further, the dual-strobe read operation takes less read time (tR) overhead, as will be explained. Other advantages will be apparent to those skilled in the art of folding data within memory devices, which will be discussed hereinafter.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices. The memory sub-system 110 can be a storage device, a memory module, or a hybrid of a storage device and memory module.

The memory device 130 can be a non-volatile memory device. One example of non-volatile memory devices is a NOT-AND (NAND) memory device. A non-volatile memory device is a package of one or more dice. Each die can include one or more planes. Planes can be groups into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

The memory device 130 can be made up of bits arranged in a two-dimensional or three-dimensional grid, also referred to as a memory array. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a NOT-AND (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single-level cells (SLC) can store one bit per cell. Other types of memory cells, such as multi-level cells (MLCs), triple-level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, the controller 115 (e.g., processing device) includes an error-correcting code (ECC) encoder/decoder 111. The ECC encoder/decoder 111 can perform ECC encoding for data written to the memory devices 130 and ECC decoding for data read from the memory devices 130, respectively. The ECC decoding can be performed to decode an ECC codeword to correct errors in the raw read data, and in many cases also to report the number of bit errors in the raw read data. The memory sub-system controller 115 can further include a processor 117 (processing device) configured to execute instructions stored in local memory 119 for performing the operations described herein. The local memory 119 can also buffer data being used by the executed instructions.

In at least some embodiments, the controller 115 further includes a memory interface component 113 that can handle interactions of the controller 115 with the memory devices of the memory sub-system 110, such as with the memory device 130. For example, the memory interface component 113 can generate and transmit a copyback clear command to the memory device 130, retrieve pass and fail indicator values from the memory device, and retrieve health status data with which to determine whether to perform an error correction or to perform a refresh of SLC data stored in a set of the SLC memory cells before a copyback is performed on the SLC data. These aspects of the memory interface 113 can be variably included, in part or in whole, within functionality of the host system 120 in some embodiments.

In various embodiments, the memory device 130 further includes one or more page buffers 152, which can provide the circuitry used to program data to the memory cells of the memory device 130 and to read the data out of the memory cells. The local media controller 135 can further include a program manager 136, which is implemented using firmware, hardware, or a combination of firmware and hardware. In one embodiment, the program manager 136 receives a copyback clear command from the memory interface 113. The program manager 136 can execute the copyback clear command to determine whether to proceed with performing a copyback of data from SLC memory cells to HLC memory cells without further intervention by the controller 115, or whether to wait for the controller 115 to determine whether to perform error correction or a refresh of the data stored in the SLC memory cells before performing a copyback operation. In some embodiments, the program manager 136 is part of the host system 110, an application, or an operating system. Further details with regards to the operations of program manager 136 are described below.

Figure 1B:
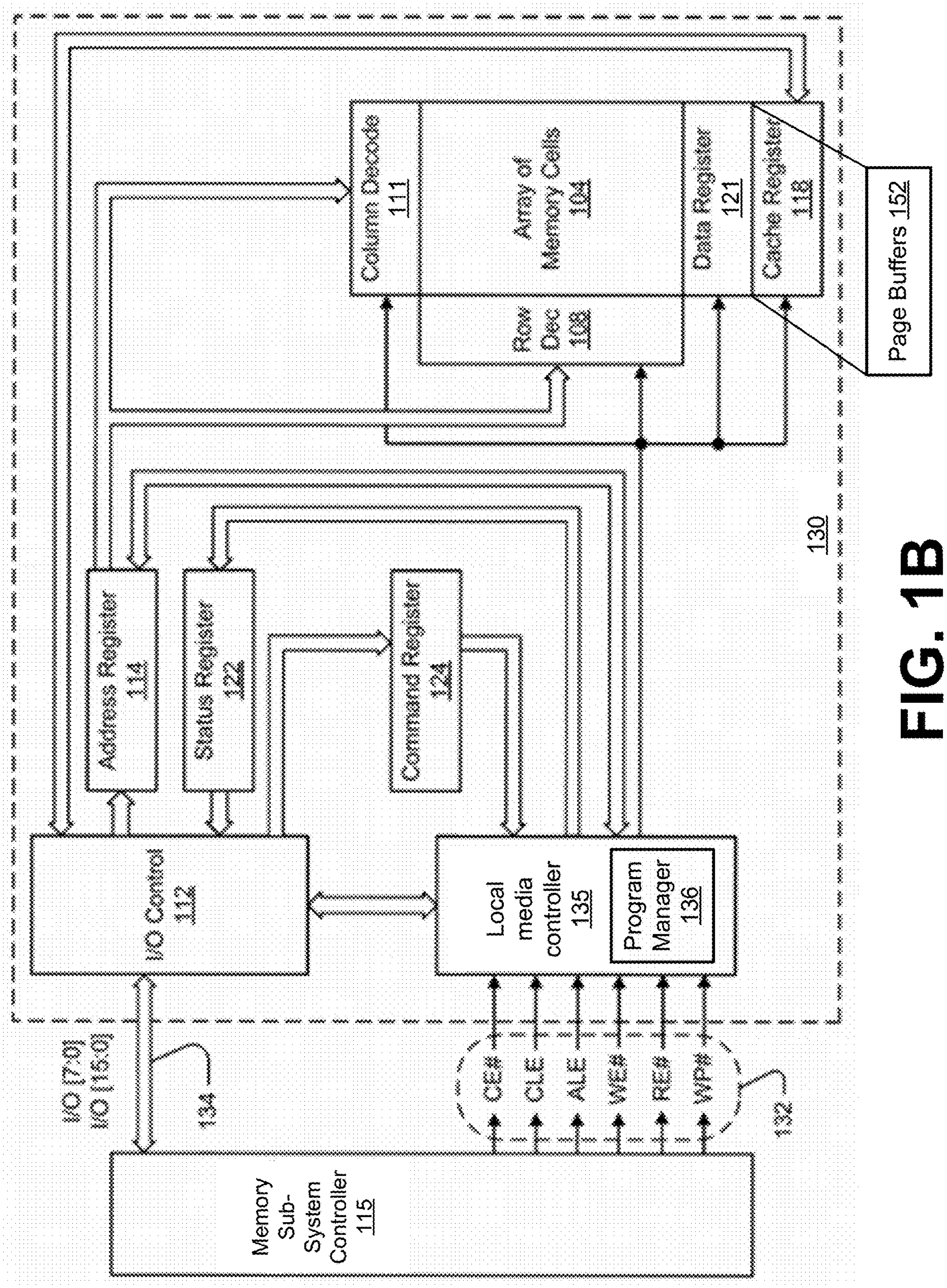
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bitline). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 111 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 111 to latch the address signals prior to decoding. A command register 124 is in communication with the I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses. The local media controller 135 can also include the program manager 136, as was discussed.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) a page buffer of the one or more page buffers 152 of the memory device 130. Each page buffer can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
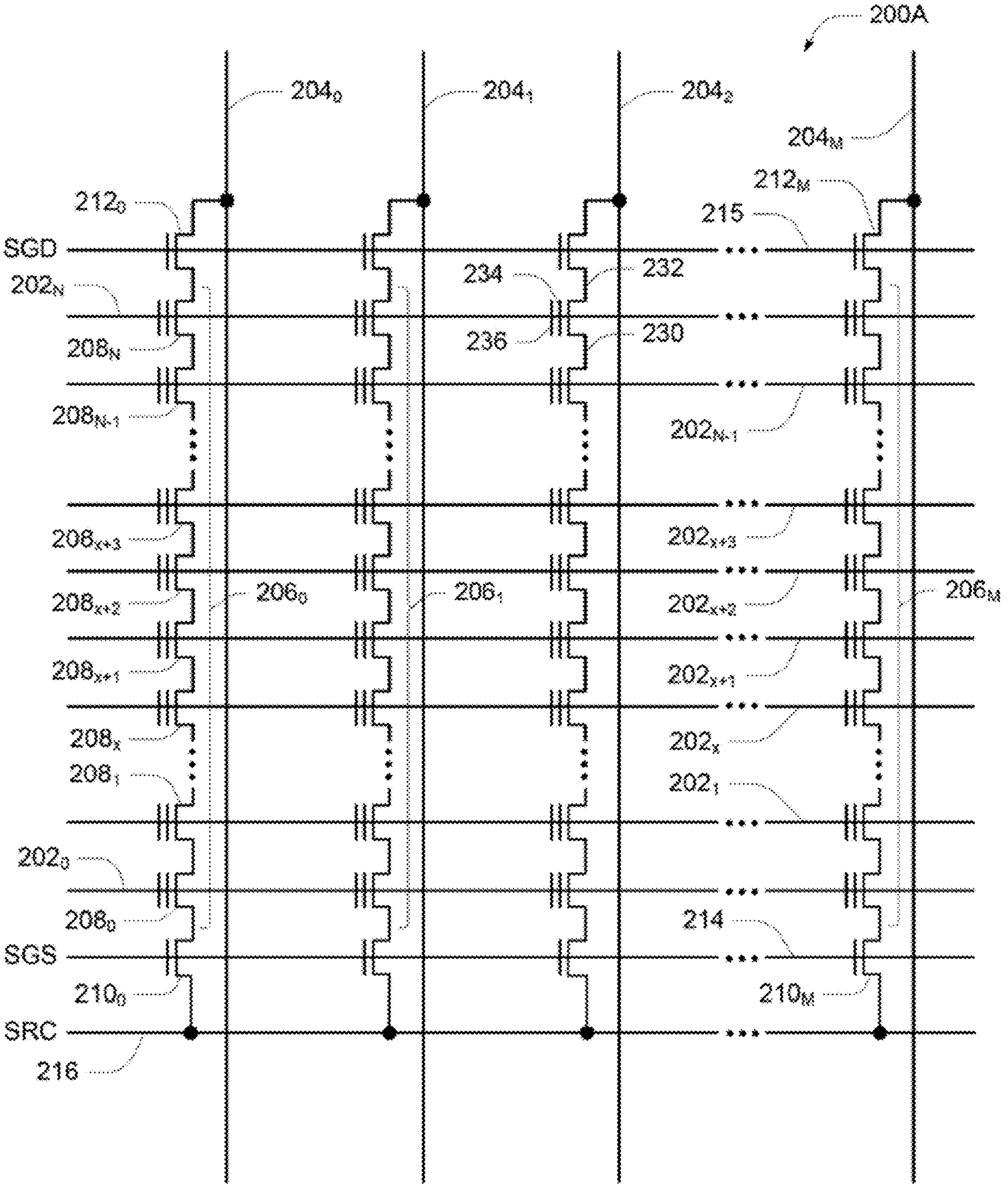
FIG. 2A-2B are schematics of portions of an array of memory cells as could be used in a memory of the type described with reference to FIG. 1B according to an embodiment.
Figure 2B:
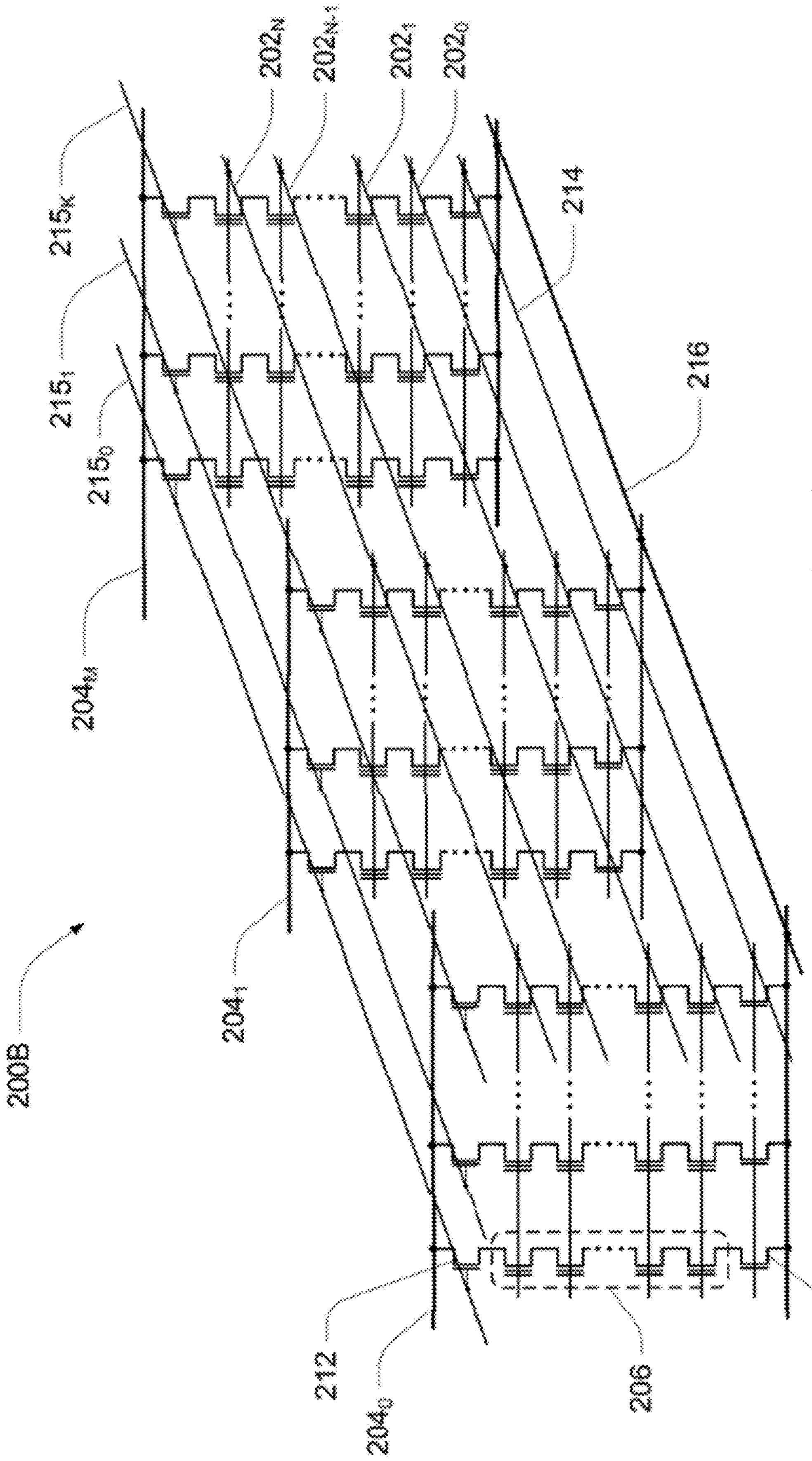

FIG. 2A-2B are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as wordlines $\mathbf{202}_0$ to $\mathbf{202}_N$, and data lines, such as bitlines $\mathbf{204}_0$ to $\mathbf{204}_M$. The wordlines 202 can be connected to global access lines (e.g., global wordlines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a wordline 202) and columns (each corresponding to a bitline 204). Each column can include a string of series-connected memory cells (e.g., non-volatile memory cells), such as one of NAND strings $\mathbf{206}_0$ to $\mathbf{206}_M$. Each NAND string 206 can be connected (e.g., selectively connected) to a common source (SRC) 216 and can include memory cells $\mathbf{208}_0$ to $\mathbf{208}_N$. Each bitline 204 and NAND string 206 can be associated with a sub-block of a set of sub-blocks of the memory array 200A. The memory cells 208 can represent non-volatile memory cells for storage of data. The memory cells 208 of each NAND string 206 can be connected in series between a select gate 210 (e.g., a field-effect transistor), such as one of the select gates $\mathbf{210}_0$ to $\mathbf{210}_M$ (e.g., that can be source select transistors, commonly referred to as select gate source), and a select gate 212 (e.g., a field-effect transistor), such as one of the select gates $\mathbf{212}_0$ to $\mathbf{212}_M$ (e.g., that can be drain select transistors, commonly referred to as select gate drain). Select gates $\mathbf{210}_0$ to $\mathbf{210}_M$ can be commonly connected to a select line 214, such as a source select line (SGS), and select gates $\mathbf{212}_0$ to $\mathbf{212}_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $\mathbf{208}_0$ of the corresponding NAND string 206. For example, the drain of select gate $\mathbf{210}_0$ can be connected to memory cell $\mathbf{208}_0$ of the corresponding NAND string $\mathbf{206}_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $\mathbf{212}_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bitline 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to wordline $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$-$204_5$ are not explicitly depicted in FIG. 2A, it is apparent from the figure that the bitlines 204 of the array of memory cells 200A can be numbered consecutively from bitline $204_0$ to bitline $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $215_0$-$215_K$ to selectively activate particular select transistors 212 each between a NAND string 206 and a bitline 204. The select transistors 210 can be activated by biasing the select line 214. Each wordline 202 can be connected to multiple rows of memory cells of the memory array 200B. Rows of memory cells that are commonly connected to each other by a particular wordline 202 can collectively be referred to as tiers.

Figure 3A:
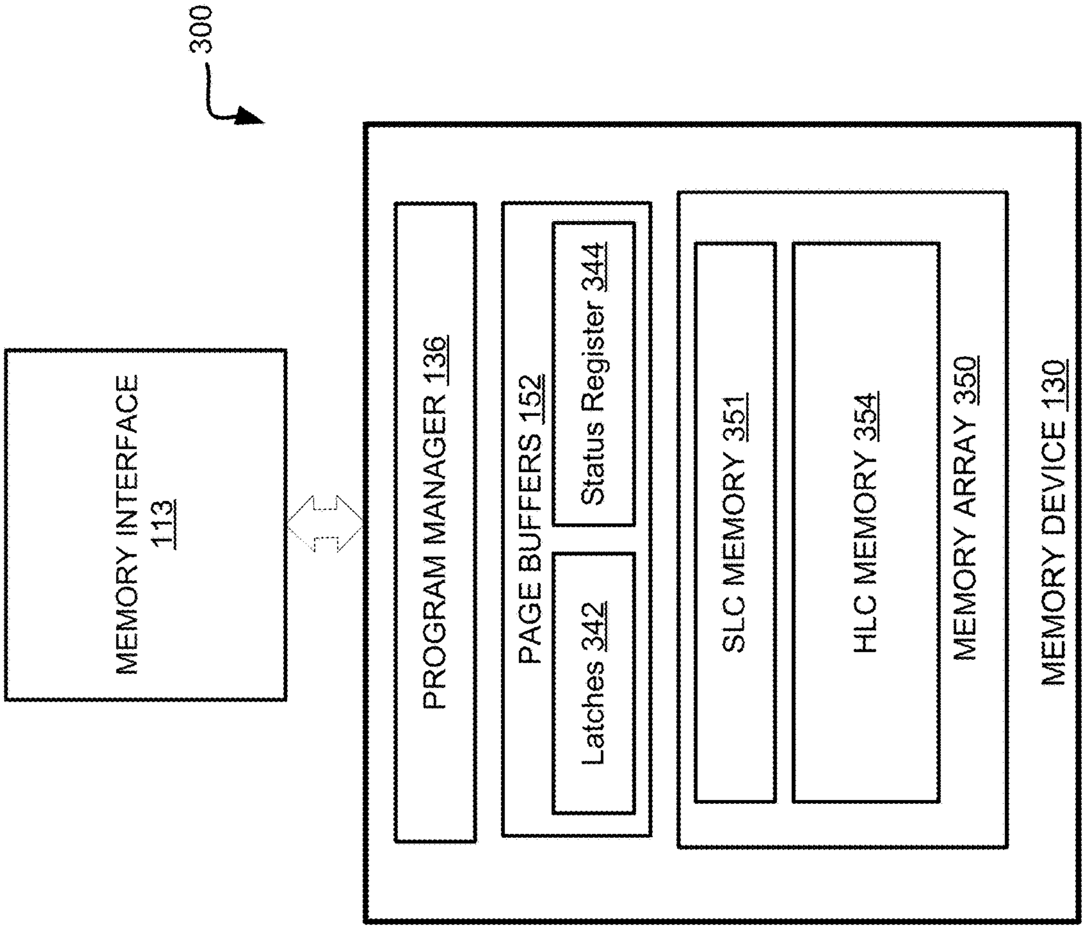
FIG. 3A is a block diagram of a memory sub-system implementing generating and handling of a copyback clear command according to at least some embodiments.

FIG. 3A is a block diagram of a memory sub-system 300 implementing generating and handling of a copyback clear command according to at least some embodiments. In some embodiments, memory device 130 is operatively coupled with memory interface 113. In one embodiment, memory device 130 includes the program manager 136, the one or more page buffers 152, and a memory array 350, which is one example of the array of memory cells of the parallel planes illustrated in FIGS. 2A-2B. The memory array 350 can include an array of memory cells formed at the intersections of wordlines and bitlines, as explained with reference to FIGS. 2A-2B. In these embodiments, each page buffer of the one or more page buffers 152 includes latches (at least a first latch and a second latch) and a status register 344. The status register 344 may also be located outside the one or more pages buffers 152 within the memory device. 130.

In various embodiments, the memory cells are grouped into blocks, and the blocks are further grouped into block stripes across the planes. In one embodiment, there can be a first portion 351 of the memory array 350 where the blocks are configured as SLC memory and a second portion 354 of the memory array 350 where the blocks are configured as HLC memory. In another embodiments, the first portion 351 is a first memory array and the second portions 354 is a second memory array. In these embodiments, the HLC memory can include blocks configured as one or more of MLC memory, TLC memory, QLC memory, PLC memory, or other type of memory. Further, in at least some embodiments, the SLC memory is treated as cache to the HLC memory.

In certain memory devices, as a result of program erase cycling (PEC) and/or a large change in temperature between when memory cells are programmed and when the memory cells are read, memory cells can experience high raw bit error rate (RBER) events where gross tails of threshold voltage distributions can cause valleys to at least partially collapse. This at least partial collapse of valleys between threshold voltage distributions (see FIG. 4B, for example) produces too many high reliability errors (HRER) when SLC data is placed into final bit-per-cell (PBC) configuration, e.g., for copying back from the SLC memory to the HLC memory. These errors can be caused intrinsically through high cycle, high temperature difference, and/or high disturb workloads, and correcting these errors is increasingly important, as SLC endurance demand is increasing and valley collapse and/or high RBER events become more dominant at those higher cycles. The errors can also be exhibited extrinsically through pillar, channel, or wordline defects. The memory sub-system 300, particularly the memory interface 113, scans for these potential errors to know whether it is time to retire a block, refresh the block, or the like. Maintaining dedicated managed reads for all SLC blocks, however, is infeasible due to firmware complexity and quality-of-service reasons, e.g., the performance impacts of calibration overhead within the memory device 130.

Further, the existing practice of performing scans on SLC data before performing a copy back involves performing a hard strobe generally in the middle of a valley between two threshold voltage distributions, which is a standard read operation to return a dataset (e.g., one or more bits of data) from the threshold voltage distributions. The reliability of this standard read is checked by employing a separate pair of soft strobes, one soft strobe to each side of the hard strobe to determine which bits are low confidence or high confidence. The soft strobes can build an XOR of information inside the valley to determine which bits are low confidence or high confidence. For example, the information obtained from the soft strobes can be passed through a log-likelihood ratio (LLR) operator used as a part of an error correction operation to determine whether to perform an error correction or to refresh the SLC data. Thus, the LLR would return a binary of low or high reliability. These scans, however, are performed across entire blocks of memory cells because any wordline could be defective. Further, each read that is checked by the controller 115 requires two reads in these memory devices, the hard strobe and the pair of soft strobes. This existing practice is inefficient, takes significant overhead in performing two separate reads, and thus drives up memory access latency, reducing quality-of-service.

In various solution-based embodiments discussed herein, the memory interface 113 (e.g., processing device) employs the use of a copyback clear command, which is also referred to herein as a single bit soft bit read (SBSBR) command. This copyback clear command can be formatted differently, e.g., via adding a prefix or a suffix to an existing program command or via generating an entirely different program command. In these embodiments, the copyback clear command directs the memory device 130 to perform an initial health check of the SLC data, which if passes, allows the memory device to automatically proceed with the copyback of the SLC data without further intervention (e.g., performing a full scan or error correction) by the memory sub-system controller. For example, the program manager 136 (e.g., control logic) of the memory device 130 can act on a copyback clear command received from the memory interface 113.

Figure 4B:
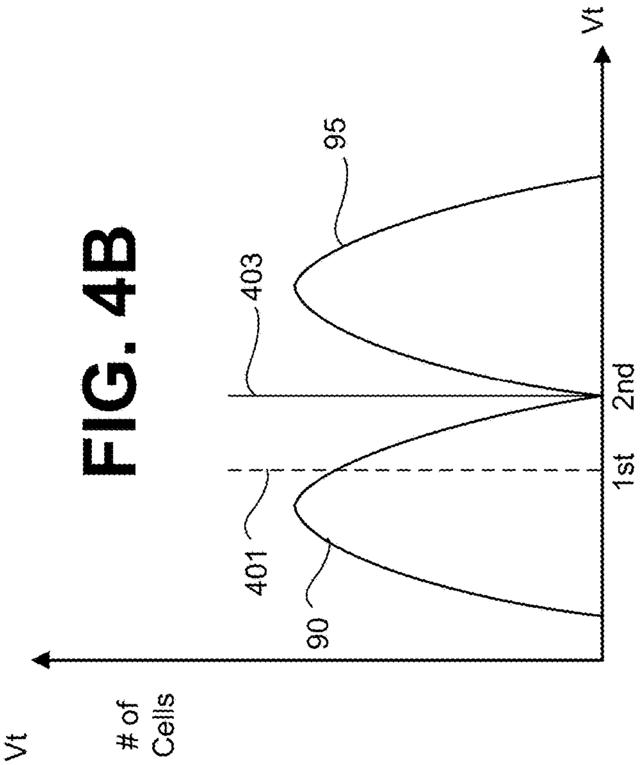
FIG. 4B is a graph illustrating a dual-strobe read operation within a valley of an SLC memory cell that fails the copyback clear according to at least one embodiment.
Figure 4A:
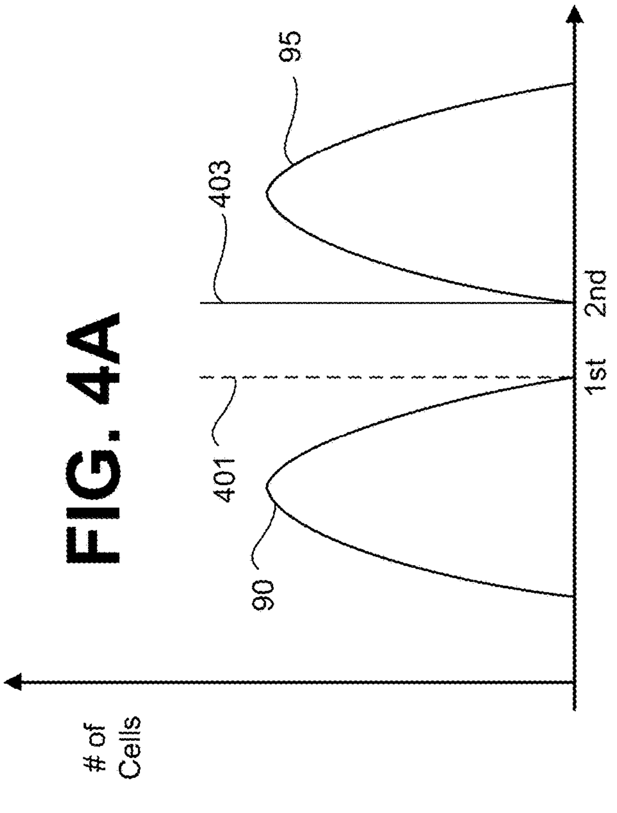
FIG. 4A is a graph illustrating a dual-strobe read operation within a valley of a single-level cell (SLC) that passes the copyback clear according to at least one embodiment.

In these embodiments, in executing the copyback clear or SBSBR command, the program manager 136 causes a page buffer of the one or more page buffers 152 to perform a dual-strobe read operation on targeted SLC memory cells, which can include a block, multiple blocks, and/or a stripe of memory cells. FIG. 4A is a graph illustrating a dual-strobe read operation within a valley of SLC memory cells that passes the copyback clear according to at least one embodiment. FIG. 4B is a graph illustrating a dual-strobe read operation within a valley of an SLC memory cell that fails the copyback clear according to at least one embodiment. In at least some embodiments, the dual-strobe read operation includes a soft strobe 401 at a first threshold voltage (1st) and a hard strobe 403 at a second threshold voltage (2nd), the first threshold voltage and the second threshold voltage being sensed approximately between threshold voltage distributions of a set of the first memory cells (e.g., of the SLC memory cells). In other words, the first and second threshold voltages are targeted to fall within the valley identified between the threshold voltage distributions. In these embodiments, the hard strobe and the soft strobe are performed serially as a single, enhanced read operation in response to a single copyback clear command.

In some embodiments, a threshold voltage range between the first and second threshold voltages is a predetermined voltage range employed in response to each copyback clear command. In at least some embodiments, the page buffer targets the hard strobe 403 at a lower tail of a highest threshold voltage distribution 95 of the threshold voltage distributions and target the soft strobe 401 at an upper tail of a lowest threshold voltage distribution 95 of the threshold voltage distributions. In other embodiments, the page buffer targets the hard strobe 403 at an upper tail of the lowest threshold voltage distributions 90 and targets the soft strobe 401 at a lower tail of the highest threshold voltage distribution, which is the opposite of that illustrated in FIGS. 4A-4B.

In at least these embodiments, the program manager 136 further causes the page buffer to determine a number of one bit values within the threshold voltage distributions 90 and 95 detected in the threshold voltage range between the first threshold voltage and the second threshold voltage. The more one bit values detected stored in the first memory cells within the threshold voltage range, the higher the likelihood that the RBER is going to be too high. As can be seen in FIG. 4A, there are no one bit values between the first and second threshold voltages, which would mean that the copyback clear command would pass. In contrast, FIG. 4B illustrates many one bit values that would be detected between the first and second threshold voltages, e.g., such that the copyback clear command would fail.

In at least some embodiments, the program manager 136 further causes, in response to the number of one bit values not satisfying a threshold criterion, a copyback be performed of data in the set of the first memory cells to a set of the second memory cells (e.g., the HLC memory cells) without intervention from the processing device. The threshold criterion, for example, can be a value corresponding to a specific HRER, which if satisfied, indicates an RBER that is too high to pass the initial health check. This specific HRER can be somewhat lower than the previously mentioned particular HRER to take caution in clearing the SLC data of errors without a full error check. Thus, if the threshold criterion is satisfied, the control logic does not cause the copyback of the data to be performed and the memory sub-system controller can perform further error checking.

In these embodiments, the program manager 136 further causes the page buffer to store, in the status register 344, either a pass indicator value or a fail indicator value depending on whether the number of one bit values satisfies the threshold criterion. The status register 344 can be accessible by the processing device, which can thus know the health status of the SLC data before deciding how to proceed in relation to the copyback of the SLC data to the set of the second memory cells. In response to detecting the pass indicator value in the status register 344, for example, the memory interface 113 (of the controller 115) can take no further action, enabling the memory device 130 to perform a copyback of the data to the set of the second memory cells. In response to detecting the fail indicator value in the status register 344, the memory interface 113 can retrieve health data from a set of the latches 342 of the memory device and determine, from the health data, whether to perform an error correction or a block refresh on the set of the first memory cells, e.g., depending on how many one bit values are detected within the threshold voltage range between the threshold voltage distributions.

Figure 3B:
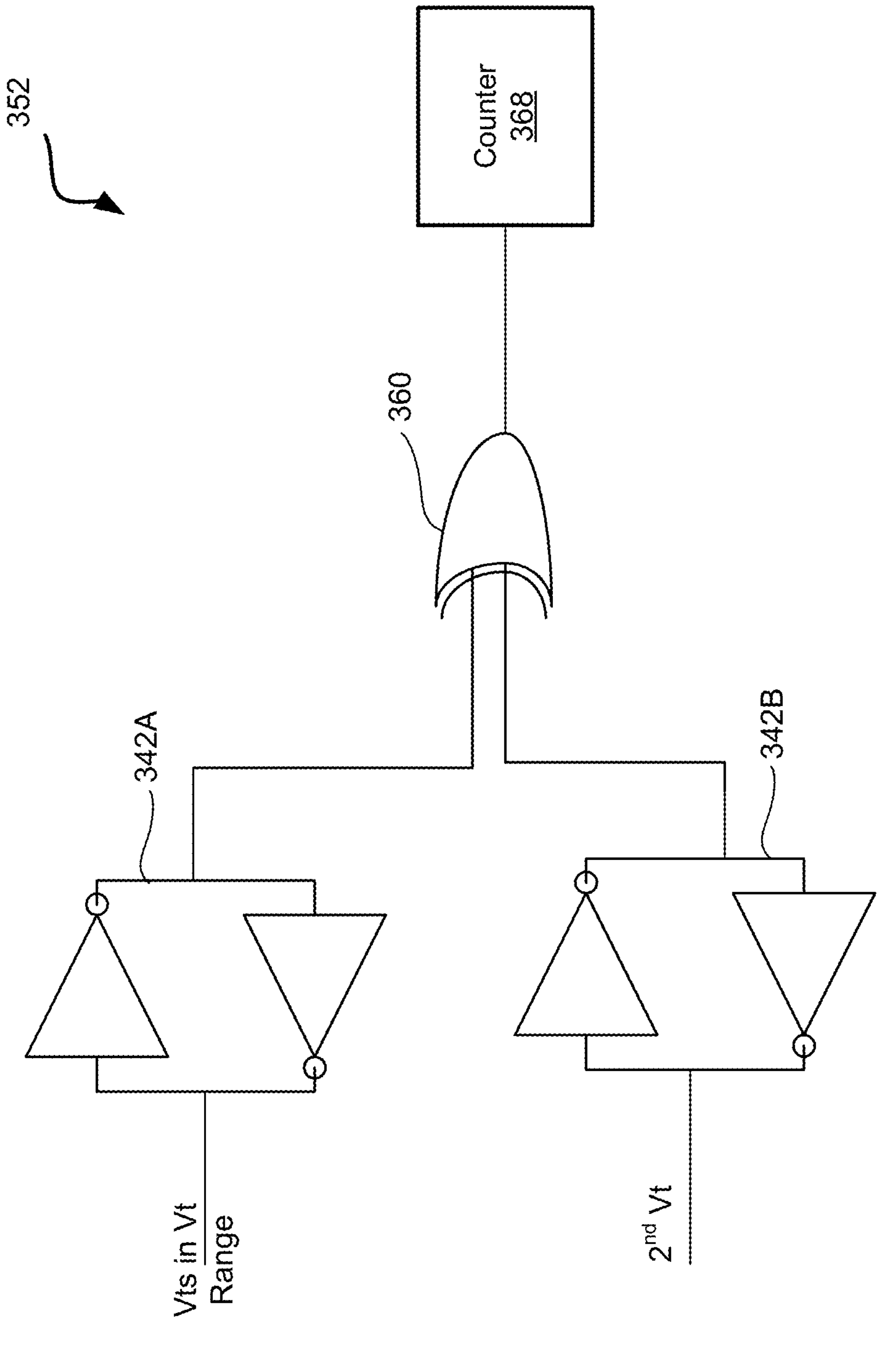
FIG. 3B is circuit diagram of a page buffer of the memory sub-system according to at least some embodiment.

FIG. 3B is circuit diagram of a page buffer 352 of the memory sub-system 300 according to at least some embodiment. In some embodiments, the page buffer 352 of the one or more page buffers 152, for example, includes a first latch 342A to store each threshold voltage stored in the memory cells detected having a threshold voltage within the threshold voltage range. In these embodiments, the page buffer 352 further includes a second latch 342B to store the second threshold voltage and an exclusive OR (XOR) gate 360 (or XOR logic) receiving, as inputs, outputs from the first latch 342A and the second latch 342B. The page buffer 352 can further include a counter 368 to count the number of one bit values that are detected by the XOR gate 360. Thus, a one bit value is only detected when a particular threshold voltage in the threshold voltage range is one and the second threshold voltage is zero. The hard probe can be directed at the end of the tail of the threshold voltage distribution so that the second threshold voltage should usually be zero. In this way, the page buffer 352 can step through counting of the one bit values stored in the memory cells within the threshold voltage range between the threshold voltage distributions.

Figure 5:
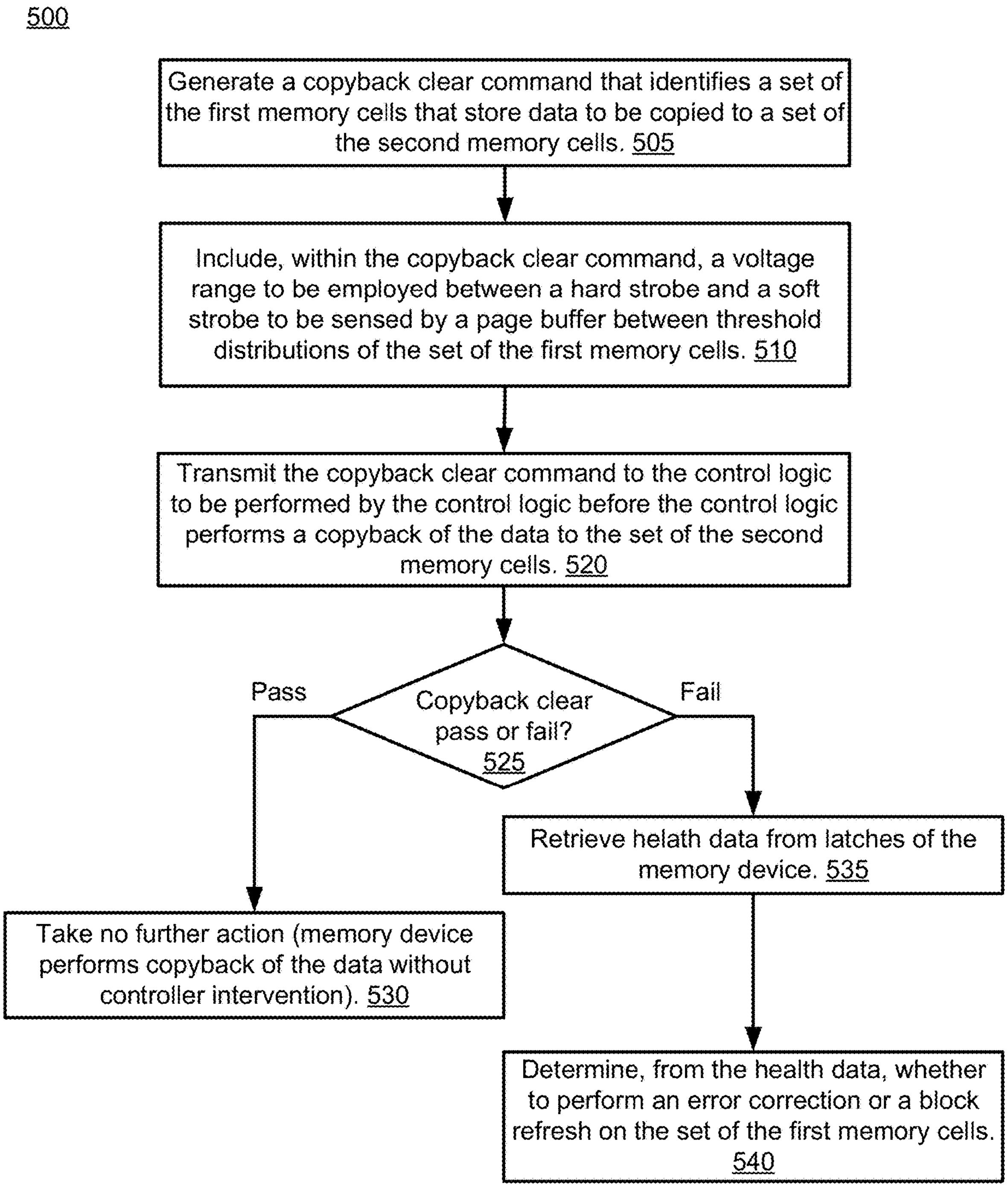
FIG. 5 is a flow diagram of a method for generating a copyback clear command and reacting to results of the copyback clear according to at least some embodiments.

FIG. 5 is a flow diagram of a method 500 for generating a copyback clear command and reacting to results of the copyback clear according to at least some embodiments. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the memory interface 113 of the controller 115 (e.g., processing device) of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, a copyback clear command is generated. More specifically, the processing logic generates a copyback clear command that identifies a set of the first memory cells that store data to be copied to a set of the second memory cells.

At operation 510, a voltage range is specified. More specifically, the processing logic includes, within the copyback clear command, a voltage range to be employed between a hard strobe and a soft strobe to be sensed by a page buffer between threshold distributions of the set of the first memory cells.

At operation 520, the copyback clear command is transmitted. More specifically, the processing logic transmits the copyback clear command to the control logic (e.g., of the local media controller 135) to be performed by the control logic before the control logic performs a copyback of the data to the set of the second memory cells.

At operation 525, a pass/fail determination is made. More specifically, the processing logic detects, in a status register of the memory device, a pass indicator value or a fail indicator values as results of the copyback clear command, which has been executed by the memory device.

At operation 530, the copyback is allowed to proceed. More specifically, the processing logic, in response to detecting the pass indicator value, takes no further action, enabling the memory device to perform a copyback of the data to the set of the second memory cells.

At operation 535, additional health checks are performed. More specifically, the processing logic, in response to detecting the fail indicator values, retrieves health data from a set of latches of the memory device.

At operation 540, a choice between error correction and data refresh is made. More specifically, the processing logic determines, from the health data, whether to perform an error correction or a block refresh on the set of the first memory cells.

Figure 6:
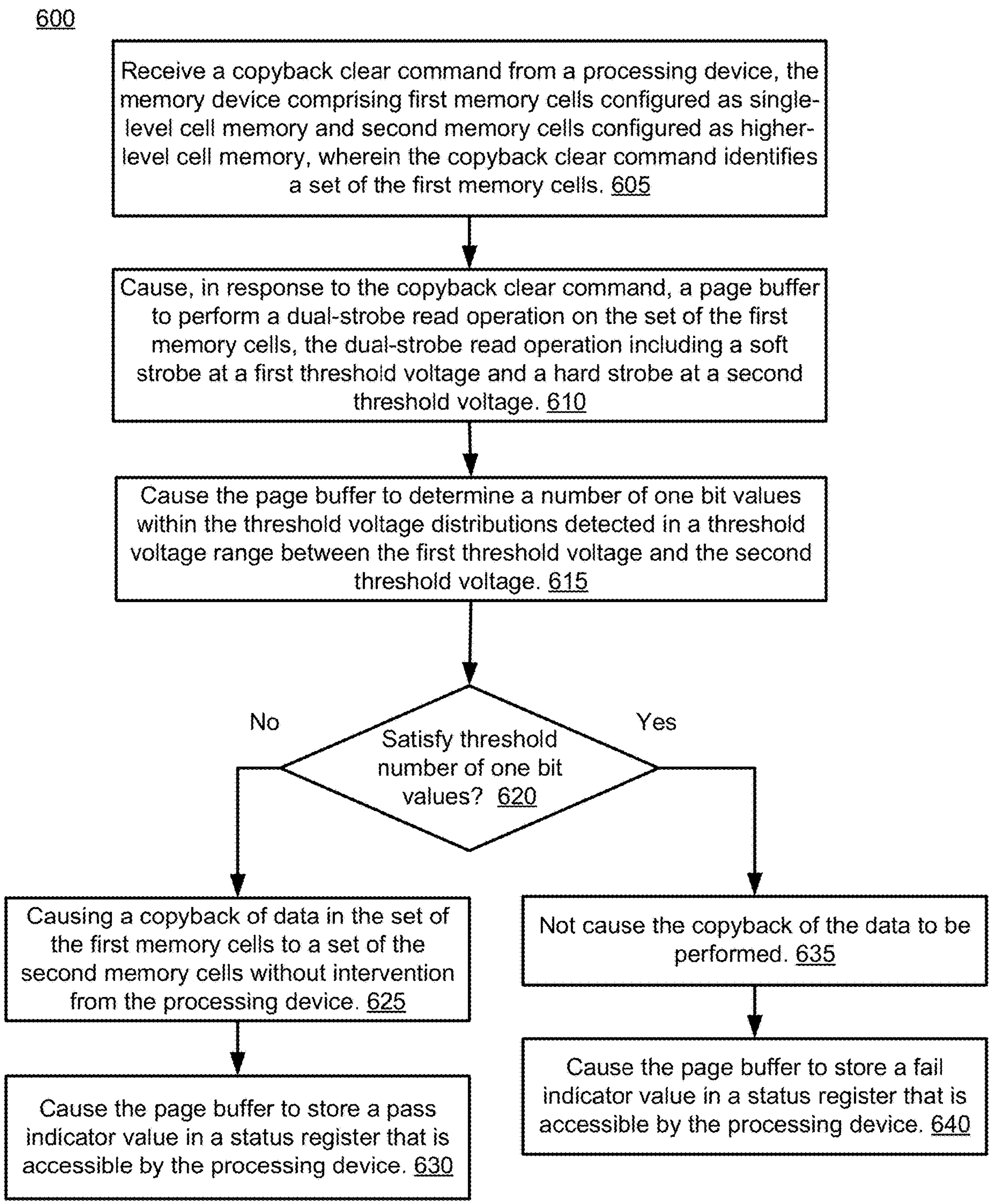
FIG. 6 is a flow diagram of a method for executing the copyback clear command and performing the copyback when the copyback clear command passes according to at least one embodiment.

FIG. 6 is a flow diagram of a method 600 for executing the copyback clear command and performing the copyback when the copyback clear command passes according to at least one embodiment. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the local media controller 135 of FIGS. 1A-1B, e.g., by control logic of the program manager 136 of the memory device 130. The memory device 130 includes first memory cells configured as single-level cell memory and second memory cells configured as higher-level cell memory. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 605, a copyback clear command is received. More specifically, the processing logic receives a copyback clear command from a processing device, the copyback clear command identifying a set of the first memory cells that are a target of the copyback clear command.

At operation 610, cause a dual-strobe read operation. More specifically, the processing logic causes, in response to the copyback clear command, a page buffer to perform a dual-strobe read operation on the set of the first memory cells. The dual-strobe read operation includes a soft strobe at a first threshold voltage and a hard strobe at a second threshold voltage, the first threshold voltage and the second threshold voltage being sensed approximately between threshold voltage distributions of the set of the first memory cells.

At operation 615, a number of one bit values is determined. More specifically, the processing logic causes the page buffer to determine a number of one bit values within the threshold voltage distributions detected in a threshold voltage range between the first threshold voltage and the second threshold voltage.

At operation 620, the one bit values are checked against a threshold. More specifically, the processing logic determines whether the number of one bit values satisfied a threshold criterion. The threshold criterion, for example, can be a value corresponding to a specific HRER, which if satisfied, indicates an RBER that is too high to pass the initial health check. This specific HRER can be somewhat lower than the previously mentioned particular HRER to take caution in clearing the SLC data of errors without a full error check.

At operation 625, the copyback proceeds without processing device intervention. More specifically, the processing logic causes, in response to the number of one bit values not satisfying a threshold criterion, a copyback of data in the set of the first memory cells to a set of the second memory cells without intervention from the processing device.

At operation 630, the pass value indictor is stored. More specifically, the processing device causes the page buffer to store a pass indicator value in a status register that is accessible by the processing device.

At operation 635, the copyback does not proceed. More specifically, the processing logic, in response to number of one bit values satisfying the threshold criterion, does not cause the copyback of the data to be performed.

At operation 640, the fail indicator value is stored. More specifically, the processing logic causes the page buffer to store a fail indicator value in the status register that is accessible by the processing device.

Figure 7:
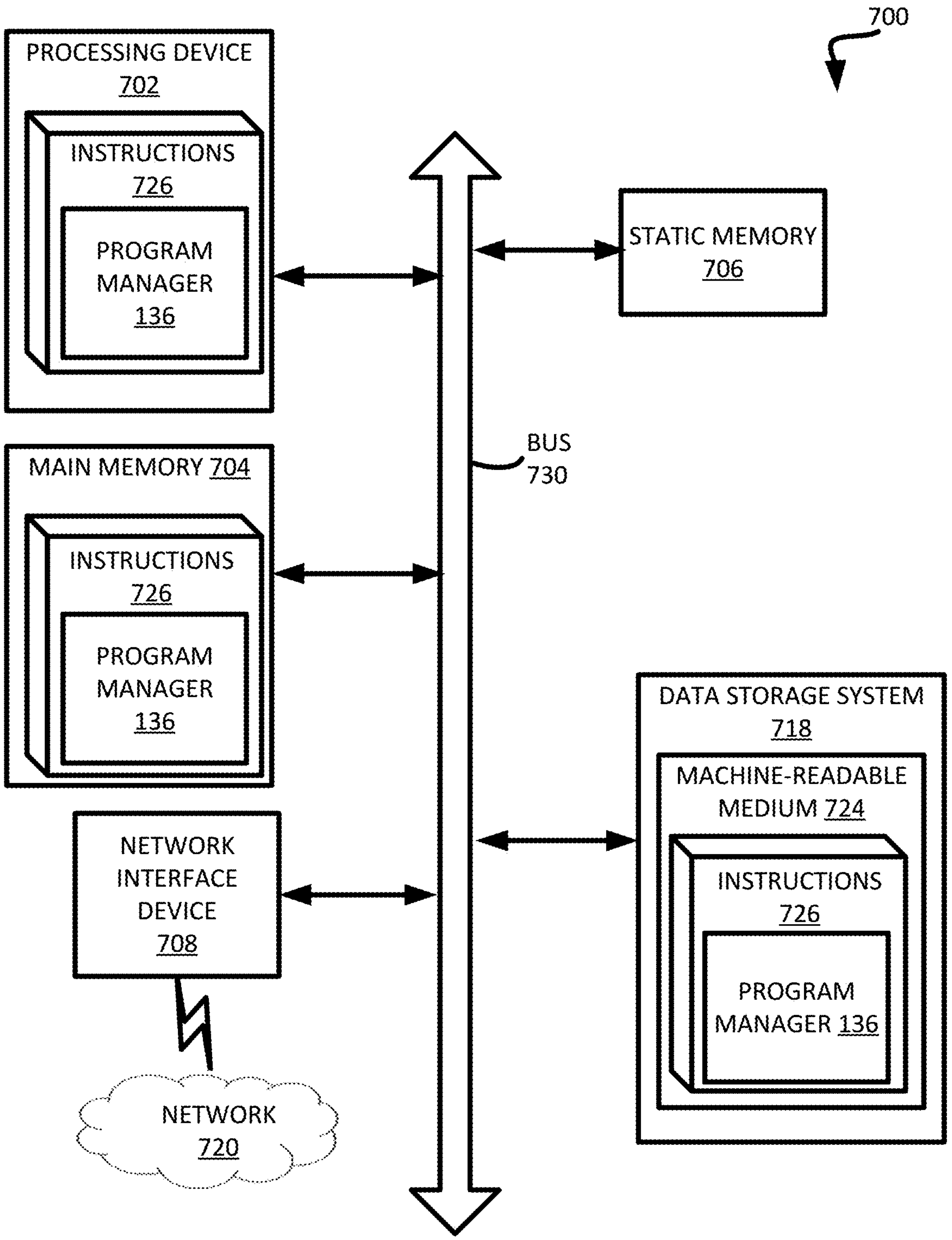
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the memory sub-system controller 115 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 710 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 728 for performing the operations and steps discussed herein. The computer system 700 can further include a network interface device 712 to communicate over the network 720.

The data storage system 718 can include a machine-readable storage medium 724 (also known as a computer-readable medium) on which is stored one or more sets of instructions 728 or software embodying any one or more of the methodologies or functions described herein. The data storage system 718 can further include the local media controller 135 and the page buffer 152 or 352 that were previously discussed. The instructions 728 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1A.

In one embodiment, the instructions 726 include instructions to implement functionality corresponding to a controller (e.g., the local media controller 135 of FIG. 1A-1B), e.g., which can include the program manager 136 in various embodiments. While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:

one or more arrays of memory cells including first memory cells configured as single-level cell memory and second memory cells configured as higher-level cell memory;

one or more page buffers coupled with the one or more arrays of memory cells; and control logic operatively coupled with the one or more page buffers, the control logic to perform operations comprising:

causing, in response to receipt of a copyback clear command, a page buffer of the one or more page buffers to perform a dual-strobe read operation on a plurality of the first memory cells, the dual-strobe read operation including a soft strobe at a first threshold voltage and a hard strobe at a second threshold voltage;

causing the page buffer to determine a number of one bit values within a threshold voltage range between the first threshold voltage and the second threshold voltage;

determining that the number of one bit values does not satisfy a threshold criterion; and causing, based on the determining, a copyback be performed of data in the plurality of the first memory cells to a plurality of the second memory cells.

2. The memory device of claim 1, wherein the threshold voltage range comprises a predetermined voltage range employed in response to each copyback clear command.

3. The memory device of claim 1, wherein the copyback clear command comprises a single bit soft bit read (SBSBR) command.

4. The memory device of claim 1, wherein the operations further comprise sensing the first threshold voltage and the second threshold voltage approximately between threshold voltage distributions of the plurality of the first memory cells.

5. The memory device of claim 4, wherein causing the page buffer to perform the dual-strobe read operation comprises causing the page buffer to:

target the hard strobe at a lower tail of a highest of the threshold voltage distributions; and target the soft strobe at an upper tail of a lowest of the threshold voltage distributions.

6. The memory device of claim 4, wherein causing the page buffer to perform the dual-strobe read operation comprises causing the page buffer to:

target the hard strobe at a upper tail of a lowest of the threshold voltage distributions; and target the soft strobe at a lower tail of a highest of the threshold voltage distributions.

7. The memory device of claim 1, wherein the page buffer comprises:

a first latch to store each threshold voltage stored in the memory cells detected having a threshold voltage within the threshold voltage range;

a second latch to store the second threshold voltage; and an exclusive OR gate receiving, as inputs, outputs of the first latch and the second latch.

8. The memory device of claim 1, wherein the operations further comprise causing the page buffer to store a pass indicator value in a status register that is accessible by a processing device that sent the copyback clear command.

9. The memory device of claim 1, wherein the operations further comprise, in response to the number of one bit values satisfying a threshold criterion:

causing the copyback of the data not to be performed; and causing the page buffer to store a fail indicator value in a status register that is accessible by a processing device that sent the copyback clear command.

10. A memory device comprising:

one or more arrays of memory cells including first memory cells configured as single-level cell memory and second memory cells configured as higher-level cell memory compared to the single-level cell memory;

one or more page buffers coupled with the one or more arrays of memory cells; and control logic operatively coupled with the one or more page buffers, the control logic to perform operations comprising:

causing, in response to receipt of a copyback clear command, a page buffer of the one or more page buffers to perform a dual-strobe read operation on a plurality of the first memory cells, the dual-strobe read operation including a soft strobe at a first threshold voltage and a hard strobe at a second threshold voltage;

causing the page buffer to determine a number of one bit values within a threshold voltage range between the first threshold voltage and the second threshold voltage;

determining that the number of one bit values satisfies a threshold criterion; and causing, based on the determining, copyback of data not to be performed to a plurality of the second memory cells.

11. The memory device of claim 10, wherein the threshold voltage range comprises a predetermined voltage range employed in response to each copyback clear command, and wherein the copyback clear command comprises a single bit soft bit read (SBSBR) command.

12. The memory device of claim 10, wherein the operations further comprise sensing the first threshold voltage and the second threshold voltage approximately between threshold voltage distributions of the plurality of the first memory cells.

13. The memory device of claim 12, wherein causing the page buffer to perform the dual-strobe read operation comprises causing the page buffer to:

target the hard strobe at a lower tail of a highest of the threshold voltage distributions; and target the soft strobe at an upper tail of a lowest of the threshold voltage distributions.

14. The memory device of claim 12, wherein causing the page buffer to perform the dual-strobe read operation comprises causing the page buffer to:

target the hard strobe at a upper tail of a lowest of the threshold voltage distributions; and target the soft strobe at a lower tail of a highest of the threshold voltage distributions.

15. The memory device of claim 10, wherein the page buffer comprises:

a first latch to store each threshold voltage stored in the memory cells detected having a threshold voltage within the threshold voltage range;

a second latch to store the second threshold voltage; and an exclusive OR gate receiving, as inputs, outputs of the first latch and the second latch.

16. The memory device of claim 10, wherein the operations further comprise, also based on the determining, causing the page buffer to store a fail indicator value in a status register that is accessible by a processing device that sent the copyback clear command.

17. A processing device that is operatively coupled to a memory device having one or more arrays of memory cells, wherein the processing device is to perform operations comprising:

generating a copyback clear command that identifies a plurality of first memory cells of the one or more arrays, wherein the first memory cells are configured as single-level cell memory;

inserting, within the copyback clear command, a voltage range to be employed between a hard strobe and a soft strobe to be sensed by a page buffer between threshold voltage distributions of the plurality of first memory cells; and transmitting the copyback clear command to the memory device to be performed before the memory device performs a copyback of data to a plurality of second memory cells of the one or more arrays, wherein the second memory cells are configured as higher-level cell memory compared to the single-level cell memory.

18. The processing device of claim 17, wherein generating the copyback clear command comprises one of adding a prefix or a suffix to an existing program command or generating an entirely different program command.

19. The processing device of claim 17, wherein the operations further comprise:

detecting, in a status register of the memory device, a pass indicator value as results of the copyback clear command; and taking no further action, enabling the memory device to perform a copyback of the data to the plurality of the second memory cells.

20. The processing device of claim 17, wherein the operations further comprise:

detecting, in a status register of the memory device, a fail indicator value as results of the copyback clear command;

retrieving health data from a set of latches of the memory device; and determining, from the health data, whether to perform an error correction or a block refresh on the plurality of the first memory cells.

* * * * *